United States Patent [19]

Takamizawa et al.

[11] 4,303,484
[45] Dec. 1, 1981

[54] PHOTOCURABLE ORGANOPOLYSILOXANE COMPOSITIONS

[75] Inventors: Minoru Takamizawa, Annaka; Fumio Okada, Takasaki; Yasuaki Hara; Aoki, Hisashi, both of Annaka, all of Japan

[73] Assignee: Shin-Etsu Chemical Co., Ltd., Tokyo, Japan

[21] Appl. No.: 68,593

[22] Filed: Aug. 22, 1979

[51] Int. Cl.³ .................................................. C08F 2/46
[52] U.S. Cl. ........................ 204/159.13; 204/159.22; 204/159.23; 427/44; 428/447; 428/451; 525/100; 525/102; 528/30; 528/32; 528/43
[58] Field of Search ...................... 204/159.23, 159.13, 204/159.22; 525/100, 102; 528/30, 32, 43

[56] References Cited

U.S. PATENT DOCUMENTS

| | | | |
|---|---|---|---|
| 3,636,026 | 1/1972 | Fuhr et al. | 260/448.8 R |
| 3,926,639 | 12/1975 | Rosen et al. | 204/159.15 |
| 4,008,138 | 2/1977 | Rosen et al. | 204/159.15 |
| 4,064,027 | 12/1977 | Gant | 204/159.13 |
| 4,070,526 | 1/1978 | Colquhoun et al. | 204/159.13 |
| 4,100,047 | 7/1978 | McCarty | 204/159.23 |
| 4,163,082 | 7/1979 | Romenesko | 204/159.13 |

FOREIGN PATENT DOCUMENTS 895951  3/1972  Canada ........................... 204/159.13

Primary Examiner—Harold D. Anderson
Attorney, Agent, or Firm—Toren, McGeady & Stanger

[57] ABSTRACT

A novel photocurable composition suitable for preparing, for example, release papers is proposed which is formulated with photocrosslinkable organopolysiloxanes necessitating no conventional photosensitizers. Thus, the composition comprises (a) an organopolysiloxane having at least two mercaptoalkyl, e.g. mercaptopropyl, groups bonded to the silicon atoms in a molecule,
(b) an organopolysiloxane having at least two alkenyl, e.g. vinyl groups directly bonded to the silicon atoms in a molecule, and
(c) an organopolysiloxane having at least one benzoin group

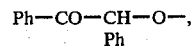

where Ph is a phenyl group, bonded to the silicon atom in a molecule, which component (c) serves as a photosensitizing ingredient. Alternatively, the inventive composition comprises (a) a mercaptoalkyl-containing organopolysiloxane as above and (b') an organopolysiloxane having, simultaneously, at least two alkenyl groups and at least one benzoin group directly bonded to the silicon atoms in a molecule, which component (b') serves both as the crosslinking agent and as the photosensitizing ingredient simultaneously. Owing to the unquestionable affinity of the photosensitizing ingredient with the other components, the inventive compositions have very high sensitivity in photocuring along with several other advantageous characteristics.

11 Claims, No Drawings

PHOTOCURABLE ORGANOPOLYSILOXANE COMPOSITIONS

BACKGROUND OF THE INVENTION

The present invention relates to a novel photocurable organopolysiloxane composition which is suitable, for example, for providing cured surface films with excellent releasability on various substrate materials by coating followed by irradiation with light rich in ultraviolet.

In particular, the invention relates to a novel photocurable organopolysiloxane composition utilizing the photo-induced crosslinking reaction between a first organopolysiloxane having at least two mercaptoalkyl groups directly bonded to the silicon atoms in a molecule and a second organopolysiloxane having at least two alkenyl groups directly bonded to the silicon atoms in a molecule sensitized with a photosensitizer of a novel type.

The above described type of photocurable organopolysiloxane compositions comprising a mercaptoalkyl-containing organopolysiloxane and an alkenyl-containing organopolysiloxane admixed with a photosensitizer is well known in the art (see, for example, Japanese Patent Disclosure No. 50-61386). Some of the prior art photosensitizers suitable for use in the above described type of the photocurable compositions are exemplified by acetophenone, benzophenone, 4-chlorobenzophenone, 4,4'-dimethoxybenzophenone, 4-methylacetophenone, azobisisobutyronitrile and benzoin ethyl ether (see, for example, U.S. Pat. No. 4,052,529).

On the other hand, it is known that photopolymerization of certain kinds of photopolymerizable organic compounds having carbon-carbon double bonds can be sensitized by several trialkylsilylesters of α-substituted or unsubstituted benzoin esters represented by the general formula

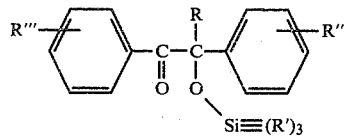

wherein R represents hydrogen, lower alkyl or alkenyl having 1 to about 4 carbon atoms, R' represents lower alkyl having 1 to about 4 carbon atoms, preferably methyl, and R" and R"', which may be identical or different, each represent hydrogen, halogen, lower alkyl having 1 to about 4 carbon atoms or methoxy group, as exemplified by benzoin-trimethylsilyl ester, α-methylbenzoin-trimethylsilyl ester and the like (see, for example, U.S. Pat. No. 3,636,026).

One of the problems in the above described photosensitizers, when used in the photocurable compositions comprising a mercaptoalkyl-containing and an alkenyl-containing organopolysiloxanes, is the poor compatibility of them with the organopolysiloxanes bringing about several disadvantages that relatively prolonged irradiation with light is necessitated to obtain complete curing and, moreover, evenness or uniformity in the photocuring can hardly be expected throughout whole areas under irradiation, that the eventual precipitation of the photosensitizer in the coating films of the cured composition results in the decreased adhesion of the films to the substrate surface as well as in an inferior releasability of the cured films to sticky substances when the cured films are formed with an object of imparting releasability, and that the presence of an organic solvent, which is necessarily formulated in the composition to accelerate the dispersion of the photo-sensitizer with low compatibility, is detrimental to the application of the composition to substrates liable to dissolution in or swelling with the organic solvent. The above defects in the photocurable compositions with a sensitizer can only be partly overcome even with the benzoin-silyl ester compounds.

SUMMARY OF THE INVENTION

It is therefore an object of the present invention to provide a novel photocurable organopolysiloxane composition free from the above described problems in the prior art and especially suitable for preparing release papers and the like having excellent premium release of aggressive adhesives applied thereto by coating various substrate materials therewith followed by irradiation with light rich in ultraviolet.

The photocurable composition of the present invention comprises (a) an organopolysiloxane having at least two mercaptoalkyl groups directly bonded to the silicon atoms in a molecule and free from aliphatic unsaturation, (b) an organopolysiloxane having at least two alkenyl groups directly bonded to the silicon atoms in a molecule, and (c) an organopolysiloxane having at least one or, preferably at least two, of benzoin groups represented by the general formula

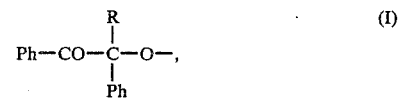

where Ph is a phenyl group and R is a hydrogen atom or a lower alkyl group having 1 to 4 carbon atoms, which organopolysiloxane being free from aliphatic unsaturation.

Alternatively, it is optional that the above mentioned alkenyl groups in the component (b) and the benzoin groups in the component (c) are simultaneously contained in one and the same organopolysiloxane. Thus, the organopolysiloxane composition as this alternative embodiment of the invention comprises (a) a mercaptoalkyl-containing organopolysiloxane as defined above, and (b') an organopolysiloxane having at least two alkenyl groups directly bonded to the silicon atoms in a molecule and at least one or, preferably, at least two of the benzoin groups as defined by the formula (I) above directly bonded to the silicon atoms in a molecule.

DETAILED DESCRIPTION OF THE PREFERRED EMBODIMENTS

As is described above, the photocurable composition of the present invention comprises three kinds of organopolysiloxanes or, alternatively, two kinds of organopolysiloxanes.

The first of the organopolysiloxanes as the component (a) is the mercaptoalkyl-containing organopolysiloxane having at least two mercaptoalkyl groups directly bonded to the silicon atoms in a molecule.

The mercaptoalkyl group has preferably from 1 to 4 carbon atoms and represented by the general formula $-C_rH_{2r}SH,$ where r is an integer from 1 to 4 inclusive, as exemplified by mercaptomethyl, mercaptoethyl, mercaptopropyl, mercaptobutyl and the like, among which mercaptopropyl group is preferred by the reasons of easiness in the synthetic preparation, stability and less unpleasant odor.

The molecular configuration of the mercaptoalkyl-containing organopolysiloxane as the component (a) is not limitative and may have a linear structure or a branched structure although those with linear structure are preferred in their good rheological properties as expressed by the formula $$(R^1)_3Si-O\text{-}[Si(R^1)_2-O]_pSi(R^1)_3, \qquad (II)$$

where $R^1$ is a substituted or unsubstituted monovalent hydrocarbon group free from aliphatic unsaturation, at least two of the $R^1$ groups in a molecule being the mercaptoalkyl groups as defined above, and p is a positive integer. The monovalent hydrocarbon groups other than the mercaptoalkyl groups can be alkyl groups such as methyl and ethyl groups and aryl groups such as phenyl group, of which methyl group is preferred.

The mercaptoalkyl containing organopolysiloxane as the component (a) in the inventive composition has desirably a viscosity of at least 10 centistokes at 25° C. from the standpoint of obtaining cured films with sufficient mechanical strengths but the viscosity should be lower than 10,000 centistokes at 25° C. when the composition is desired to be smoothly applied on to the substrate surface without being diluted with a solvent.

It is also optional that one of the three $R^1$ groups bonded to the terminal silicon atom is a hydroxy group instead of the monovalent hydrocarbon groups insofar as the above described requirements are satisfied.

Thus the mercaptoalkyl-containing organopolysiloxanes as typical examples of the component (a) are composed of two or more of mercaptopropylmethylsiloxane units $(HSCH_2CH_2CH_2)(CH_3)SiO$ and a plurality of dimethylsiloxane units $(CH_3)_2SiO$ linearly linked together and terminated at both chain ends with trimethylsilyl $(CH_3)_3Si-$ or trimethylsiloxy $(CH_3)_3Si-O-$ groups. While the mercaptoalkyl-containing organopolysiloxane as the component (a) has preferably a linear structure, it is to be understood that there can be small amounts of trifunctional siloxane units $R^1SiO_{3/2}$ that are normally present as impurity units in commercial organopolysiloxanes.

The upper limit of the viscosity of the component (a) above given should not be construed limitative since the limiting factor for the workability of the composition in the application on to the substrate surface is the viscosity of the composition and not the viscosity of the component (a) per se.

The alkenyl-containing organopolysiloxane as the component (b) is also preferably a linear diorganopolysiloxane represented by the structural formula $$(R^2)_3Si-O\text{-}[Si(R^2)_2-O]_qSi(R^2)_3, \qquad (III)$$

where $R^2$ is a substituted or unsubstituted monovalent hydrocarbon group, at least two of the $R^2$ groups in a molecule being alkenyl groups such as vinyl and allyl groups, and q is a positive integer. The $R^2$ groups other than the alkenyl groups can be alkyl groups, e.g. methyl, ethyl and the like, or aryl groups, e.g. phenyl group, among which methyl group is the most preferred and the alkenyl group is preferably a vinyl group. Thus, the organopolysiloxane as the component (b) is composed typically of two or more of methylvinylsiloxane units $(CH_3)(CH_2=CH)SiO$ and a plurality of dimethylsiloxane units $(CH_3)_2SiO$ linearly linked together and terminated at both chain ends with trimethylsilyl or trimethylsiloxy groups as in the component (a).

The viscosity of this component (b) is also desirably at least 10 centistokes at 25° C. but it is of course that the viscosity is determined in consideration of the viscosity of the final composition suitable for convenient application on to the substrate surfaces. In this respect, the upper limit of the viscosity is, though not limitative, about 10,000 centistokes at 25° C. in order that the composition is applied on to the substrate surface without dilution with a solvent.

The above given limitations for the viscosities of the components (a) and (b) should be taken into consideration that the viscosity of the resultant composition be preferably in the range from 50 to 10,000 centistokes at 25° C.

The amount of this component (b) relative to the component (a) is desirably such that the molar ratio of the alkenyl groups to the mercaptoalkyl groups is in the range from 0.5:1 to 2:1 though not limitative.

The component (c), which is also an organopolysiloxane, must have at least one or, preferably, at least two of benzoin groups expressed by the above given formula (I) per molecule. In the formula, Ph is a phenyl group and R denotes a hydrogen atom or a lower alkyl group having from 1 to 4 carbon atoms such as methyl, ethyl, propyl and butyl groups, among which hydrogen atom and methyl group are preferred by the reason of easiness in the synthetic preparation.

The benzoin-containing organopolysiloxane as the component (c) is also preferably a diorganopolysiloxane of linear structure and the benzoin group of the formula (I), which is denoted by the symbol Q for brevity hereinafter, may be positioned as bonded either to the terminal silicon atoms or to one of the silicon atoms other than the terminal silicon atoms. Thus, the benzoin-containing organopolysiloxane is typically represented by the general formula $$(Q)_a(R^3)_{3-a}Si-O\text{-}[Si(Q)(R^4)-O]_m\text{-}[Si(R^4)_2-O]_n Si(Q)_a(R^3)_{3-a} \qquad (IV)$$

Where Q is an α-substituted or unsubstituted benzoin group expressed by the above general formula (I), $R^3$ is a monovalent hydrocarbon group having from 1 to 6 carbon atoms, $R^4$ is a substituted or unsubstituted monovalent hydrocarbon group, a is 0, 1 or 2, m is 0 or a positive integer with the proviso that a and m are not simultaneously equal to zero, and n is 0 or a positive integer.

The organopolysiloxane compound of the general formula (IV) can alternatively be expressed by the unit formula below:

$$[(Q)_a(R^3)_{3-a}SiO_{0.5}]_2[Si(Q)(R^4)O]_m[Si(R^4)_2O]_n, \qquad (V)$$

where Q, $R^3$, $R^4$, a, m and n each have the same meaning as defined above.

In the formulas (IV) or (V), Q is the benzoin group of the formula (I) as defined above, $R^3$ denotes a monovalent hydrocarbon group having from 1 to 6 carbon atoms free from aliphatic unsaturation such as an alkyl group exemplified by methyl, ethyl, propyl, butyl, pentyl and hexyl groups and phenyl group, and $R^4$ is a substituted or unsubstituted monovalent hydrocarbon group free from aliphatic unsaturation such as alkyl and aryl groups as well as those groups derived therefrom by the substitution of part or all of the hydrogen atoms thereof with halogen atoms, cyano groups and the like.

The above general formulas (IV) or (V) and the definitions of the symbols require that the inventive organopolysiloxane compound as the component (c) has at least one benzoin group of the general formula (I) per molecule regardless of the position of the silicon atom to which it is bonded.

In the following, several of the examples in conformity with the above general formula (IV) or (V) and the definitions of the symbols described above are given. In the structural formulas given below and thereafter, Me, Et, Vi and Ph each denote methyl, ethyl, vinyl and phenyl groups, respectively, and $Q^1$ and $Q^2$ each denote a benzoin group and an α-methylbenzoin group expressed by the following formulas, respectively.

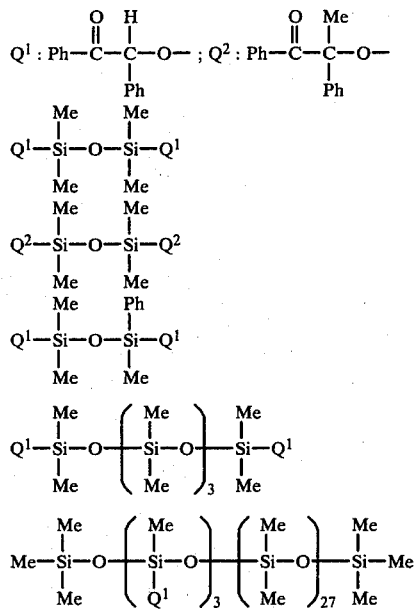

The molecular weight of the benzoin-bonded organopolysiloxane is not particularly limited but it is recommendable that the degree of polymerization, i.e. number of the silicon atoms in a molecule, does not exceed 200 or, more preferably, 50 since higher molecules are highly viscous or solid so as that the compatibility of the component (c) with the other components is reduced. The lower limit in the degree of polymerization of the benzoin-bonded organopolysiloxane is about 10, though not limitative.

The component (c) is formulated in the inventive composition in an amount from 1 to 30 parts by weight per 100 parts by weight of the component (a). This is because that any smaller amounts than the above range cannot give sufficient photosensitizing effect to the composition while larger amounts than above bring about impractical expensiveness without particular additional advantages.

As is mentioned earlier, it is an alternative embodiment of the present invention that the benzoin groups represented by the general formula (I) and the alkenyl groups are bonded to the silicon atoms in one and the same molecule of an organopolysiloxane. Thus, the photocurable composition of the present invention according to this second embodiment comprises
(a) a mercaptoalkyl-containing organopolysiloxane as defined before and
(b') an organopolysiloxane having at least two alkenyl groups directly bonded to the silicon atoms in a molecule and at least one or, preferably, at least two of the benzoin groups of the general formula (I) bonded to the silicon atoms in a molecule.

Examples of such organopolysiloxanes as the component (b') containing simultaneously both of the alkenyl groups, e.g. vinyl groups, and the benzoin groups are as follows, in which the meaning of the symbols are as defined before.

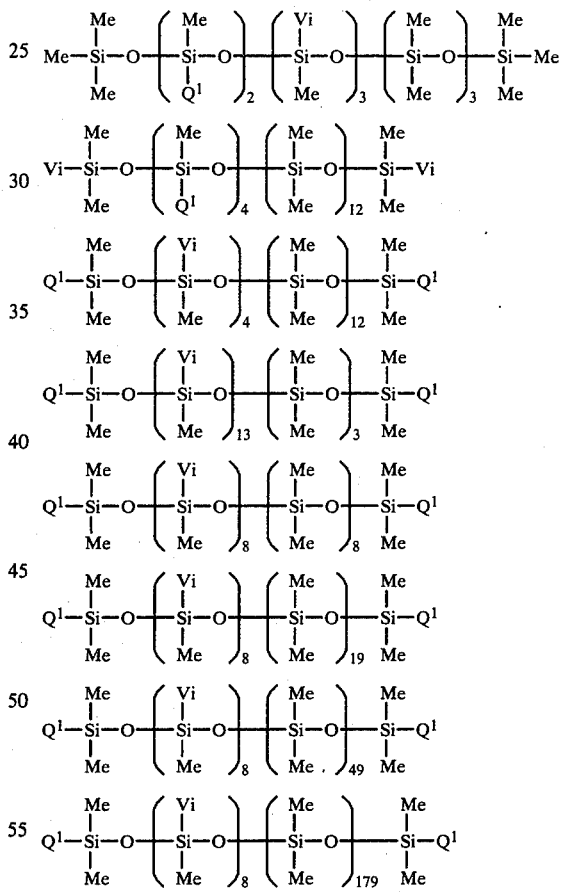

The amount of this component (b') relative to the component (a) can be the same as in the ratio of the amounts of the components (a) and (b). That is, it is recommended that from 0.5 to 2 of the alkenyl groups in the component (b') are provided per one of the mercaptoalkyl groups in the component (a). With this molar ratio of the mercaptoalkyl groups to the alkenyl groups, sufficiently large numbers of the benzoin groups are always provided as bonded to the organopolysiloxane of the component (b') and the problem of low compatibility of the benzoin-bonded organopolysiloxane with the other components no longer exists. The viscosity requirement for the component (b') is about the same as for the component (b).

The photocurable composition of the present invention can be prepared by merely blending the components (a), (b) and (c) or (a) and (b') uniformly in proportions as described above and no solvent for dilution is necessitated if the viscosity of each of the components is chosen as described above although it is optional to use an organic solvent when a particularly low viscosity of the composition is desired.

When the inventive composition is prepared without using a solvent, advantages are obtained not only in that the drying step otherwise indispensable to be a cause of air pollution can be omitted after application of the composition on to the substrate surface but also in that the composition is applicable even to a substrate made of a plastic resin which is susceptible to the attack by the organic solvent contained in the composition so as that broadening of the objective substrate materials is accomplished including papers, woods, metal foils, plastics, leathers, ceramics and the like.

The photocurable composition of the present invention is curable by irradiation with light rich in ultraviolet such as the light beams emitted from a high pressure mercury lamp, xenon lamp and the like. The photosensitivity of the inventive composition is so high that even a fraction of a second of the irradiation time is sufficient for the complete curing when the irradiation is carried out with a conventional lamp of readily available output positioned at a distance of some tens of centimeters from the substrate materials coated with the composition.

Following are the examples to illustrate the present invention in further detail, in which parts are all given by parts by weight.

In the following Examples, the curing time, adhesivity, peeling resistance and residual adhesion were determined each in a manner as described below.

Curing time

A kraft paper or a polystyrene film uniformly coated with the composition in a coating amount to give a coating layer of 1 μm thick was rapidly moved at a varied velocity directly underside an opaque mask having a 5 cm wide aperture in the direction of the width of the aperture and irradiated with two high-pressure mercury lamps of each 2 kilowatts power emitting mainly at a wavelength of 365 nm positioned above the aperture at a distance of 8 cm. The curing time in second was calculated by dividing 5 cm with the velocity of the kraft paper or polystyrene film in cm/second. The curing time recorded was the time in which tack-free surface of the coating layer was obtained.

Adhesivity

Adhesivity of the cured composition was evaluated as "good" when the cured layer was not peeled off by rubbing with finger tip from the surface of a polyethylene-laminated paper to which the composition was applied followed by complete curing by irradiation with light.

Peeling resistance

Determination was carried out according to JIS Z 1523.

Residual adhesion

An adhesive tape of 0.5 inch wide (Scotch Tape No. 28, a product of Sumitomo 3M Co., Japan) was applied and bonded to a film of fluorocarbon resin and a film of polystyrene coated with the composition with a thickness of 1 μm and subjected to photocuring of the composition followed by keeping in an atmosphere at 23° C. with a relative humidity of 65% for 24 hours.

The laminates of the adhesive tape and the films of fluorocarbon resin or polystyrene were pressed under a pressure of 20 kg/cm² for 20 hours at 23° C. and then kept in an atmosphere at 23° C. with a relative humidity of 65% for 3 hours with the pressure removed. The adhesive tapes were then peeled off the films of the fluorocarbon resin or polystyrene and transferred on to the surface of a well-polished stainless steel plate where the adhesive tapes were bonded with a tape roller of 2 kg load moved once back and forth on the adhesive tapes. After 30 minutes of standing, the peeling resistance of the adhesive tapes from the stainless steel plate was determined by pulling in a 180° direction with a peeling velocity of 300 mm/minute by use of a tensile tester.

The peeling resistance of the adhesive tape obtained with the polystyrene film was compared with the corresponding value obtained with the film of fluorocarbon resin and the result was expressed by the ratio of the former value to the latter in %.

EXAMPLE 1 (EXPS. NO. 1 to NO. 5)

Photocurable compositions were prepared each by uniformly blending 100 parts of a mercaptopropyl-containing organopolysiloxane having a viscosity of 2,000 centistokes at 25° C. and composed of 97% by moles of dimethylsiloxane units and 3% by moles of mercaptopropylmethylsiloxane units linearly linked together and terminated at both chain ends with trimethylsilyl groups, 10 parts of a benzoin-bonded dimethylpolysiloxane having two benzoin-dimethylsilyl groups at the chain ends and a degree of polymerization of 21, and one of the vinyl-containing organopolysiloxanes given below in such an amount that one mole of the vinyl groups is provided per mole of the mercaptopropyl groups in the mercaptopropyl-containing organopolysiloxane.

Table 1 below gives the results with a kraft paper as the substrate for the minimum time for complete photocuring, the adhesivity and the peeling resistance against three kinds of adhesive agents, i.e. a gum-based adhesive, solvent-type adhesive containing an acrylic resin and an aqueous emulsion of an acrylic resin.

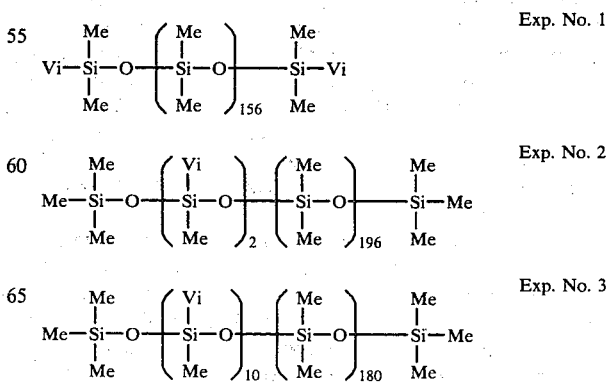

-continued

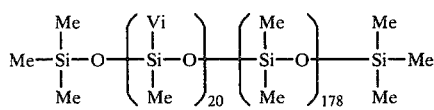

Exp. No. 4

[Me₃SiO₀.₅ · ViSiO₁.₅]ₙ  Exp. No. 5

TABLE 1

| Exp. No. | Curing time, seconds | Adhesivity | Peeling resistance, g/5 cm |  |  |
|---|---|---|---|---|---|
|  |  |  | Gum-base Adhesive | Acrylic resin solution | Acrylic resin emulsion |
| 1 | 0.06 | good | 37 | 115 | 15 |
| 2 | 0.06 | good | 49 | 30 | 21 |
| 3 | 0.06 | good | 25 | 51 | 21 |
| 4 | 0.06 | good | 27 | 250 | 20 |
| 5 | 0.06 | good | 21 | 42 | 11 |

EXAMPLE 2 (EXPS. NO. 6 to NO. 10)

Photocurable compositions were prepared each by uniformly blending 50 parts of a mercaptopropyl-containing organopolysiloxane having a viscosity of 1,500 centistokes at 25° C. and composed of 95% by moles of dimethylsiloxane units and 5% by moles of mercaptopropylmethylsiloxane units linearly linked together and terminated at both chain ends with trimethylsilyl groups, 50 parts of a vinyl-containing organopolysiloxane expressed by the structural formula

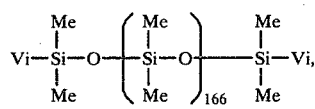

which are available from Shin-Etsu Chemical Co., Japan, with a product name of VF-1000, 0.01 part of 2,6-di-tert-butyl-p-cresol and 5.0 parts of a dimethylpolysiloxane with a varied degree of polymerization n indicated in Table 2 below and terminated at both chain ends with benzoin-dimethylsilyl groups.

The results of the testing with a kraft paper as the substrate for the minimum time for complete photocuring and the peeling resistance against three kinds of the adhesive agents as in Example 1 were as set out in Table 2. The adhesivity was good in all of these compositions.

TABLE 2

| Exp. No. | Degree of Polymerization, n | Curing time, seconds | Peeling resistance, g/5 cm |  |  |
|---|---|---|---|---|---|
|  |  |  | Gum-base adhesive | Acrylic resin solution | Acrylic resin emulsion |
| 6 | 5 | 0.04 | 36 | 65 | 65 |
| 7 | 17 | 0.06 | 40 | 55 | 31 |
| 8 | 21 | 0.06 | 40 | 56 | 30 |
| 9 | 50 | 0.15 | 38 | 40 | 25 |
| 10 | 200 | 0.60 | 29 | 41 | 20 |

EXAMPLE 3 (EXPS. NO. 11 to NO. 16)

Photocurable compositions were prepared each by uniformly blending 10 parts of a mercaptopropyl-containing organopolysiloxane composed of mercaptopropylmethylsiloxane units alone with a degree of polymerication of 20 and terminated at both chain ends with trimethylsilyl groups, 90 parts of a vinyl-containing organopolysiloxane having a viscosity of about 2,300 centistokes at 25° C. and composed of 87% by moles of dimethylsiloxane units, 8% by moles of diphenylsiloxane units and 3% by moles of vinylmethylsiloxane units, the balance being the terminal trimethylsiloxy groups, linearly linked together and terminated at both chain ends with trimethylsilyl groups, 0.05 part of 2,6-di-tert-butyl-p-cresol and 10 parts of a benzoin-bonded organopolysiloxane expressed by the following structural formula

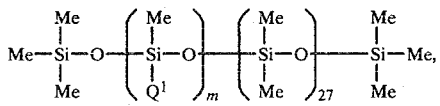

in which m was varied as indicated in Table 3 below.

The curing and peeling tests were undertaken with a kraft paper as the substrate coated with these compositions to give the results of the minimum irradiation time for complete photocuring and the peeling resistance against 3 kinds of the adhesives as set out in Table 3 (Exps.No. 11 to No. 15).

For comparison (Exp. No. 16), the above benzoin-bonded organopolysiloxane was replaced with the same amount of the benzoin-bonded organopolysiloxane used in Exp. No.8 of Example 2.

For further comparison (Exp.No. 17), an equivalent organopolysiloxane to that used in Exp. No. 12, in which the benzoin groups $Q^1$ were replaced with equal number of α-methylbenzoin groups $Q^2$, was used, the other experimental conditions being the same as above.

The results of these Experiments No. 16 and No. 17 are also included in the same table.

TABLE 3

| Exp. No. | m | Curing time, seconds | Peeling resistance, g/5 cm |  |  |
|---|---|---|---|---|---|
|  |  |  | Gum-base adhesive | Acrylic resin solution | Acrylic resin emulsion |
| 11 | 0 | not cured | — | — | — |
| 12 | 3 | 0.6 | 198 | 67 | 280 |
| 13 | 6 | 0.15 | 133 | 47 | 215 |
| 14 | 9 | 0.15 | 140 | 50 | 210 |
| 15 | 27 | 0.06 | 135 | 48 | 210 |
| 16 | — | 0.6 | 168 | 59 | 265 |
| 17 | (3) | 0.6 | 200 | 60 | 250 |

EXAMPLE 4. (EXP. NO. 18)

A photocurable composition was prepared by uniformly blending 100 parts of a mercaptopropyl-containing organopolysiloxane having a viscosity of 1,100 centistokes at 25° C. and composed of 97% by moles of dimethylsiloxane units and 3% by moles of mercaptopropylmethylsiloxane units linearly linked together and terminated at both chain ends with trimethylsilyl groups having an average degree of polymerization of about 17 and 5 parts of a vinyl-and benzoin-containing organopolysiloxane composed of 53% by moles of dimethylsiloxane units and 47% by moles of vinylmethylsiloxane units linearly linked together and terminated at both chain ends with benzoin-dimethylsilyl groups.

The minimum curing time of the above prepared photocurable composition was determined by irradiating the coating film of the composition with a thickness of 1 μm on a polystyrene film treated in advance by corona discharge with two high pressure mercury lamps of each 2 kilowatts power positioned above the film at a distance of 8 cm to find that the curing was complet with 0.3 second of irradiation.

curing and the residual adhesion were examined to give the results set out in Table 4 below.

TABLE 4

| Exp. No. | Vinyl- and benzoin-containing organopolysiloxane Structural formula | Viscosity at 25° C. centistokes | Curing time, seconds | Residual adhesion, % |
|---|---|---|---|---|
| 19 | $Q^1\text{-Si(Me)(Me)-O-[Si(Me)(Me)-O]}_{11}\text{-[Si(Me)(Vi)-O]}_4\text{-Si(Me)(Me)-Q}^1$ | 77.3 | 0.06 | 85 |
| 20 | $Q^1\text{-Si(Me)(Me)-O-[Si(Me)(Me)-O]}_{2}\text{-[Si(Me)(Vi)-O]}_{13}\text{-Si(Me)(Me)-Q}^1$ | 82.0 | 0.60 | 92 |
| 21 | $Q^1\text{-Si(Me)(Me)-O-[Si(Me)(Me)-O]}_{7}\text{-[Si(Me)(Vi)-O]}_{8}\text{-Si(Me)(Me)-Q}^1$ | 78.5 | 0.30 | 88 |
| 22 | $Q^1\text{-Si(Me)(Me)-O-[Si(Me)(Me)-O]}_{18}\text{-[Si(Me)(Vi)-O]}_{8}\text{-Si(Me)(Me)-Q}^1$ | 92 | 0.15 | 85 |
| 23 | $Q^1\text{-Si(Me)(Me)-O-[Si(Me)(Me)-O]}_{48}\text{-[Si(Me)(Vi)-O]}_{8}\text{-Si(Me)(Me)-Q}^1$ | 143 | 0.15 | 81 |
| 24 | $Q^1\text{-Si(Me)(Me)-O-[Si(Me)(Me)-O]}_{178}\text{-[Si(Me)(Vi)-O]}_{8}\text{-Si(Me)(Me)-Q}^1$ | 702 | 0.30 | 80 |

EXAMPLE 5. (EXPS. NO. 19 to NO. 24)

Photocurable compositions were prepared each by uniformly blending the same mercaptopropyl-containing organopolysiloxane as used in Example 4 with one of the vinyl- and benzoin-containing organopolysiloxanes listed in Table 4 below in such a blending ratio that the molar ratio of the mercaptopropyl groups in the former to the vinyl groups in the latter is equal to 2.0.

Each of the above prepared photocurable compositions was applied on to a polystyrene film treated in advance by corona discharge in a coating thickness of 1 μm and subjected to curing in the same manner as in Example 4. The minimum irradiation time for complete curing and the residual adhesion were examined to give the results set out in Table 4 below.

EXAMPLE 6. (EXPS. NO. 25 to NO. 30)

Photocurable compositions were prepared each by uniformly blending 100 parts of the same mercaptopropyl-containing organopolysiloxane as used in Example 4, 5 parts of a vinyl-containing organopolysiloxane composed of 33.3% by moles of trimethylsiloxane units and 66.7% by moles of vinylsiloxane units and 5 parts of one of the third components as indicated in Table 5 below, these third components serving as a photosensitizing agent and being either a vinyl- and benzoin-containing organopolysiloxane according to the invention or a conventional photosensitizer.

The minimum irradiation time for complete curing of the compositions and the residual adhesion were examined in the same manner as in the preceding Examples to give the results set out in Table 5.

TABLE 5

| Exp. No. | Photosensitizing component | Curing time seconds | Residual adhesion, % |
|---|---|---|---|
| 25 | $Q^1\text{-Si(Me)(Me)-O-[Si(Me)(Me)-O]}_{12}\text{-[Si(Me)(Vi)-O]}_{4}\text{-Si(Me)(Me)-Q}^1$ | 0.06 | 85 |
| 26 | $\text{Me-Si(Me)(Me)-O-[Si(Me)(Me)-O]}_{24}\text{-[Si(Me)(Vi)-O]}_{3}\text{-[Si(Me)(Q}^1\text{)-O]}_{3}\text{-Si(Me)(Me)-Me}$ | 0.06 | 88 |

TABLE 5-continued

| Exp. No. | Photosensitizing component | Curing time seconds | Residual adhesion, % |
|---|---|---|---|
| 27 | 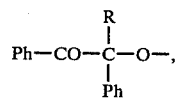 | 0.01 | 90 |

EXAMPLE 7. (EXPS. NO. 31 and NO. 32)

Photocurable compositions were prepared each by uniformly blending 100 parts of the same mercaptopropyl-containing organopolysiloxane as used in Example 6, 5 parts of the vinyl- and benzoin-containing organopolysiloxane as used in Exp. No. 26 of Example 6 and 10 parts (Exp. No. 31) or 20 parts (Exp. No. 32) of the vinyl-containing organopolysiloxane VF-1000 as used in Example 2.

The minimum irradiation time for these compositions was 0.03 second or 0.02 second, respectively, and the residual adhesion was 90% in both cases.

What is claimed is:

1. A photocurable composition comprising
   (a) an organopolysiloxane having at least two mercaptoalkyl groups directly bonded to the silicon atoms in a molecule and free from aliphatic unsaturation,
   (b) an organopolysiloxane having at least two alkenyl groups directly bonded to the silicon atoms in a molecule, and
   (c) an organopolysiloxane having at least one benzoin group represented by the general formula

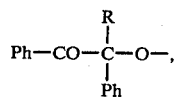

where Ph denotes a phenyl group and R denotes a hydrogen atom or a lower alkyl group having from 1 to 4 carbon atoms, and directly bonded to the silicon atom in a molecule,
   said composition having a viscosity in the range from about 50 to 10,000 centistokes at 25° C., and the amount of component (c) being from about 1 to 30 parts by weight per 100 parts by weight of component (a).

2. A photocurable composition comprising
   (a) an organopolysiloxane having at least two mercaptoalkyl groups directly bonded to the silicon atoms in a molecule and free from aliphatic unsaturation,
   (b) an organopolysiloxane having at least two alkenyl groups directly bonded to the silicon atoms in a molecule, and
   (c) an organopolysiloxane free from aliphatic unsaturation and having at least one benzoin group represented by the general formula

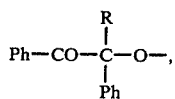

where Ph denotes a phenyl group and R denotes a hydrogen atom or a lower alkyl group having from 1 to 4 carbon atoms, and directly bonded to the silicon atom in a molecule,
   said composition having a viscosity in the range from about 50 to 10,000 centistokes at 25° C., and the amount of component (c) being from about 1 to 30 parts by weight per 100 parts by weight of component (a).

3. A photocurable composition comprising
   (a) an organopolysiloxane having at least two mercaptoalkyl groups directly bonded to the silicon atoms in a molecule and free from aliphatic unsaturation, and
   (b') an organopolysiloxane having at least two alkenyl groups directly bonded to the silicon atoms in a molecule and at least one benzoin group represented by the general formula $$\text{Ph}-\text{CO}-\underset{\underset{\text{Ph}}{|}}{\overset{\overset{R}{|}}{C}}-\text{O}-,$$

where Ph denotes a phenyl group and R denotes a hydrogen atom or a lower alkyl group having from 1 to 4 carbon atoms, and directly bonded to the silicon atom in the molecule,
   said composition having a viscosity in the range from about 50 to 10,000 centistokes at 25° C., and the amount of component (b') being from about 1 to 30 parts by weight per 100 parts by weight of component (a).

4. The photocurable composition according to claim 1, 2 or 3 wherein the symbol R in the benzoin group denotes a hydrogen atom.

5. The photocurable composition according to claim 1 or 2 wherein the organopolysiloxane as the component (c) has at least two benzoin groups per molecule.

6. The photocurable composition according to claim 3 wherein the organopolysiloxane as the component (b') has at least two benzoin groups per molecule.

7. The photocurable composition according to claim 1 or 2 wherein the ratio of the amount of the organopolysiloxane as the component (b) to the amount of the organopolysiloxane as the component (a) is such that from 0.5 to 2.0 moles of the alkenyl groups in the component (b) are provided per mole of the mercaptoalkyl groups in the component (a).

8. The photocurable composition according to claim 3 wherein the ratio of the amount of the component (b') to the amount of the component (a) is such that from 0.5 to 2.0 moles of the alkenyl groups in the component (b') are provided per mole of the mercaptoalkyl groups in the component (a).

9. The photocurable composition according to claim 1, 2 or 3 wherein the mercaptoalkyl group is mercaptopropyl group.

10. The photocurable composition according to claim 1 or 2 wherein the alkenyl group in the component (b) is vinyl group.

11. The photocurable composition according to claim 3 wherein the alkenyl group in the component (b') is vinyl group.

* * * * *